(12) United States Patent
Peng et al.

(10) Patent No.: US 11,264,595 B2
(45) Date of Patent: Mar. 1, 2022

(54) DISPLAY PANEL AND METHOD OF MANUFACTURING THE SAME

(71) Applicant: WUHAN CHINA STAR OPTOELECTRONICS SEMICONDUCTOR DISPLAY TECHNOLOGY CO., LTD., Wuhan (CN)

(72) Inventors: Liying Peng, Wuhan (CN); Fenghao Cai, Wuhan (CN)

(*) Notice: Subject to any disclaimer, the term of this patent is extended or adjusted under 35 U.S.C. 154(b) by 217 days.

(21) Appl. No.: 16/753,072

(22) PCT Filed: Jan. 7, 2020

(86) PCT No.: PCT/CN2020/070567
§ 371 (c)(1),
(2) Date: Apr. 2, 2020

(87) PCT Pub. No.: WO2021/128460
PCT Pub. Date: Jul. 1, 2021

(65) Prior Publication Data
US 2021/0408466 A1 Dec. 30, 2021

(30) Foreign Application Priority Data
Dec. 24, 2019 (CN) .......................... 201911351330.4

(51) Int. Cl.
H01L 51/52 (2006.01)
H01L 51/56 (2006.01)
H01L 51/00 (2006.01)

(52) U.S. Cl.
CPC ...... H01L 51/5253 (2013.01); H01L 51/0097 (2013.01); H01L 51/56 (2013.01)

(58) Field of Classification Search
None
See application file for complete search history.

(56) References Cited

U.S. PATENT DOCUMENTS

2014/0254112 A1 9/2014 Okumoto et al.
2015/0214504 A1 7/2015 Sonoda et al.
(Continued)

FOREIGN PATENT DOCUMENTS

CN 104521323 A 4/2015
CN 105938873 A 9/2016
(Continued)

OTHER PUBLICATIONS

Machine translation of CN 109461829 (Year: 2019).*

Primary Examiner — J. E. Schoenholtz

(57) ABSTRACT

A display panel disclosed in the embodiments of the present application includes a substrate layer, a first inorganic layer, a plurality of first organic layers, a second inorganic layer, and a plurality of second organic layers. The first inorganic layer is disposed on the substrate layer, and a plurality of first receiving structures are disposed on a side of the first inorganic layer away from the substrate layer. The first organic layers are respectively disposed in the first receiving structures. The second inorganic layer is disposed on the first inorganic layer and the first organic layers, and a plurality of second receiving structures are disposed on a side of the second inorganic layer away from the substrate layer. The second organic layers are respectively disposed in the second receiving structures.

20 Claims, 2 Drawing Sheets

(56) References Cited

U.S. PATENT DOCUMENTS

2016/0322601 A1* 11/2016 Lee .................... H01L 51/5256
2017/0271623 A1   9/2017 Wang et al.
2018/0123087 A1   5/2018 Tang
2019/0036076 A1   1/2019 Tang
2019/0237699 A1*  8/2019 Hu ..................... H01L 27/3276

FOREIGN PATENT DOCUMENTS

| CN | 106684256 A |   | 5/2017  |
|----|-------------|---|---------|
| CN | 107482127 A |   | 12/2017 |
| CN | 109411622 A |   | 3/2019  |
| CN | 109461824 A |   | 3/2019  |
| CN | 109461829 A | * | 3/2019  |

* cited by examiner

DISPLAY PANEL AND METHOD OF MANUFACTURING THE SAME

FIELD OF INVENTION

The present disclosure relates to the field of display technologies, and more particularly, to a display panel and a method of manufacturing the same.

BACKGROUND OF INVENTION

With the development of organic light-emitting diode (OLED) display panel technology, flexible display OLED display panels are more and more popular with the public.

In order to achieve flexible display, the encapsulation layers with reduced thickness in the OLEDs have become the current trend. However, such encapsulation layers are the film layer structures in which an inorganic film layer, an organic film layer and an inorganic film layer are alternatively stacked. Due to the different properties between the inorganic film layer and the organic film layer, the inorganic film layer easily peels from the organic film layer during bending, thereby causing failed encapsulation.

Technical Problems:

A peeling problem is prone to occur to an interface between the inorganic film layer and the organic film layer when the current OLED display panels are bent.

SUMMARY OF INVENTION

Technical Solutions:

The embodiments of the present application provide a display panel and a method of manufacturing the same, which can reduce the probability of peeling between the inorganic film layer and the organic film layer when the display panel is bent.

In a first aspect, an embodiment of the present application provides a display panel, including:

a substrate layer;

a first inorganic layer disposed on the substrate layer, and a plurality of first receiving structures being disposed on a side of the first inorganic layer away from the substrate layer;

a plurality of first organic layers respectively disposed in the first receiving structures;

a second inorganic layer disposed on the first inorganic layer and the first organic layers, and a plurality of second receiving structures disposed on a side of the second inorganic layer away from the substrate layer; and a plurality of second organic layers respectively disposed in the second receiving structures.

In the display panel provided in the embodiment of the present application, the first receiving structures are grooves or via holes, and the second receiving structures are grooves or via holes.

In the display panel provided in the embodiment of the present application, the first receiving structures are via holes, the second receiving structures are via holes, and the second receiving structures expose the first inorganic layer and the first organic layers.

In the display panel provided in the embodiment of the present application, the display panel further comprises:

a third organic layer, and the third organic layer covers the second organic layers and the second inorganic layer.

In the display panel provided in the embodiment of the present application, the third organic layer is integrally formed with the second organic layers.

In the display panel provided in the embodiment of the present application, the display panel further comprises:

a fourth inorganic layer, and the fourth inorganic layer is disposed on the third organic layer.

In the display panel provided in the embodiment of the present application, the substrate layer comprises a substrate and a flexible substrate, a light-emitting layer, and a third inorganic layer which are sequentially stacked on the substrate.

In the display panel provided in the embodiment of the present application, number of the first receiving structures is the same as number of the second receiving structures.

In the display panel provided in the embodiment of the present application, material of the first inorganic layer comprises silicon oxide, silicon nitride, silicon oxynitride, aluminum oxide, or aluminum nitride.

In the display panel provided in the embodiment of the present application, material of the first organic layers comprises epoxy-based organic material or acrylic-based organic material.

In a second aspect, an embodiment of the present application provides a method of manufacturing a display panel, comprising:

providing a substrate layer;

forming a first inorganic layer on the substrate layer, and forming a plurality of first receiving structures on a side of the first inorganic layer away from the substrate layer;

filling the each first receiving structures with organic material to form a plurality of first organic layers;

forming a second inorganic layer on the first inorganic layer and the first organic layers, and forming a plurality of second receiving structures on a side of the second inorganic layer away from the substrate layer; and filling the each second receiving structures with organic material to form a plurality of second organic layers.

In the method of manufacturing the display panel provided in the embodiment of the present application, the first receiving structures are grooves or via holes, and the second receiving structures are grooves or via holes.

In the method of manufacturing the display panel provided in the embodiment of the present application, the first receiving structures are via holes, the second receiving structures are via holes, and the second receiving structures expose the inorganic layer and the first organic layers.

In the method of manufacturing the display panel provided in the embodiment of the present application, the method further comprises:

forming a third organic layer on the second inorganic layer to cover the second organic layers and the second inorganic layer.

In the method of manufacturing the display panel provided in the embodiment of the present application, the method further comprises:

forming a fourth inorganic layer on the third organic layer.

In the method of manufacturing the display panel provided in the embodiment of the present application, the substrate layer comprises a substrate and a flexible substrate, a light-emitting layer, and a third inorganic layer which are sequentially stacked on the substrate.

In the method of manufacturing the display panel provided in the embodiment of the present application, the light-emitting layer is an organic light-emitting array.

In the method of manufacturing the display panel provided in the embodiment of the present application, number of the first receiving structures is the same as number of the second receiving structures.

In the method of manufacturing the display panel provided in the embodiment of the present application, material of the first inorganic layer comprises silicon oxide, silicon nitride, silicon oxynitride, aluminum oxide, or aluminum nitride.

In the method of manufacturing the display panel provided in the embodiment of the present application, material of the first organic layers comprises epoxy-based organic material or acrylic-based organic material.

Beneficial Effect:

The display panel provided in the embodiment of the present application comprises a substrate layer; a first inorganic layer disposed on the substrate layer; and a plurality of first receiving structures disposed on a side of the first inorganic layer away from the substrate layer; a plurality of first organic layers respectively disposed in the first receiving structures; a second inorganic layer disposed on the first inorganic layer and the first organic layers, and a plurality of second receiving structures disposed on a side of the second inorganic layer away from the substrate layer; and a plurality of second organic layers respectively disposed in the second receiving structures. The present solution can reduce the probability of peeling between the inorganic film layer and the organic film layer when the display panel is bent.

DESCRIPTION OF DRAWINGS

In order to more clearly illustrate the technical solutions in the embodiments or the prior art, the following drawings, which are intended to be used in the description of the embodiments or the prior art, will be briefly described. It is obvious that the drawings and the following description are only some embodiments of the present disclosure. Those of ordinary skill in the art may, without creative efforts, derive other drawings from these drawings.

DETAILED DESCRIPTION OF PREFERRED EMBODIMENTS

The following clearly and completely describes the technical solutions in the embodiments of the present application with reference to the accompanying drawings in the embodiments of the present application. Apparently, the described embodiments are merely some but not all of the embodiments of the present application. All other embodiments obtained by a person skilled in the art based on the embodiments of the present application without creative efforts shall fall within the protection scope of the present application.

The embodiments of the present application provide a display panel and a method of manufacturing the same, which will be described in detail below respectively.

Figure 1:
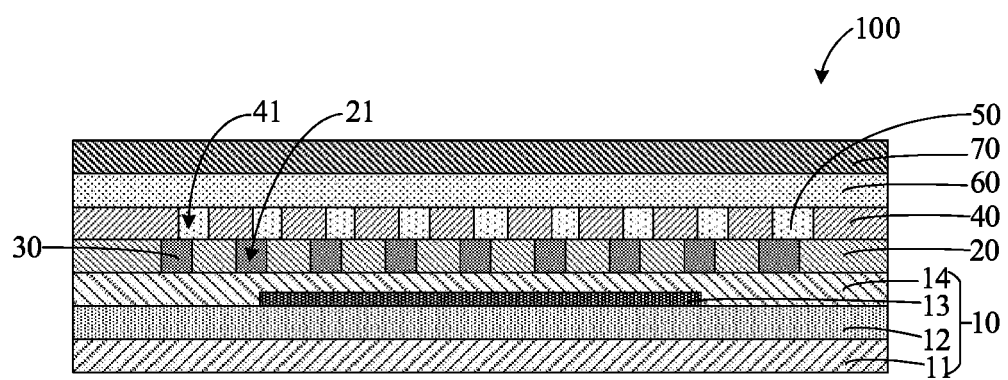
FIG. 1 is a schematic structural view of a display panel according to an embodiment of the present application.

Please refer to FIG. 1, which is a schematic structural view of a display panel provided by an embodiment of the present application. The display panel 100 may include a substrate layer 10, a first inorganic layer 20, a plurality of first organic layers 30, a second inorganic layer 40, and a plurality of second organic layers 50.

The substrate layer 10 may include a substrate 11 and a flexible substrate 12, a light-emitting structure 13, and a third inorganic layer 14 which are sequentially stacked on the substrate 11. The substrate 11 is an array substrate for driving the light-emitting structure 13 to emit light. The flexible substrate 12 may be made of a flexible material, such as polyimide. The flexible substrate 12 can increase the bending resistance of the display panel 100. The light-emitting structure 13 can implement screen display of the display panel 100. The fourth inorganic layer 14 can protect the light-emitting structure 13 to prevent the light-emitting structure 13 from being affected by external water vapor or oxygen.

The first inorganic layer 20 is disposed on the substrate layer 10. The first inorganic layer 20 may be a film layer formed of inorganic material, such as silicon oxide, silicon nitride, silicon oxynitride, aluminum oxide, or aluminum nitride. The first inorganic layer 20 can further protect the light-emitting structure 13 and other film layers to prevent the light-emitting structure 13 and other film layers from being affected by external water vapor or oxygen.

In some embodiments, in order to reduce the stress generated when the first inorganic layer 20 is bent and enhance the bending resistance of the first inorganic layer 20, a plurality of first receiving structures 21 may be disposed on a side of the first inorganic layer 20 away from the substrate layer 10, and the each first receiving structures 21 may be filled with organic material to form the plurality of first organic layers 30. It can be understood that the first organic layers 30 are respectively disposed in the first receiving structures 21. The organic material may be an epoxy-based organic material or an acrylic-based organic material.

It should be noted that, in the description of this application, the terms "first", "second", and "third" are merely used for purposes of description, and are not intended to indicate or imply relative importance or to implicitly indicate the number of indicated technical features. Thus, the features defined as "first," "second," and "third" may explicitly or implicitly include one or more of the features.

The second inorganic layer 40 may cover the first inorganic layer 20 and the first organic layers 30. The second inorganic layer 40 may be a film layer formed of inorganic material, such as silicon oxide, silicon nitride, silicon oxynitride, aluminum oxide, or aluminum nitride. The second inorganic layer 40 can further protect the light-emitting structure 13 and other film layers to prevent the light-emitting structure 13 and other film layers from being affected by external water vapor or oxygen.

In some embodiments, in order to reduce the stress generated when the second inorganic layer 40 is bent and enhance the bending resistance of the second inorganic layer 40, a plurality of second receiving structures 41 may be disposed on a side of the second inorganic layer 40 away from the substrate layer 10. In addition, the each second receiving structures 41 may be filled with organic material to form the plurality of second organic layers 50. It can be understood that the second organic layers 50 are respectively disposed in the second receiving structures 41. The organic material may be epoxy-based material or acrylic-based material.

It should be noted that the first receiving structures 21 and the second receiving structures 41 may be grooves or via holes. Number of the first receiving structures 21 is the same as number of the second receiving structures 41.

In order to further increase the adhesion between the organic film layer and the inorganic film layer, and reduce the probability of peeling between the organic film layer and the inorganic film layer when the display panel 100 is bent, in some embodiments, the first receiving structures 21 may be via holes, and the second receiving structures 41 may be via holes. The second receiving structures 41 may expose the first inorganic layer 20 and the first organic layers 30. Specifically, an orthographic projection of the second receiving structures 41 on the first inorganic layer 20 partially overlaps that of the first receiving structures 21. That is, part of the first organic layers 30 are connected to the second inorganic layer 40, and another part of the first organic layers 30 are connected to the second organic layers 50. In addition, a third organic layer 60 covering the second inorganic layer 40 and the second organic layers 50 is deposited on the second inorganic layer 40 and the second organic layers 50. Material of the third organic layer 60 may include organic material such as an epoxy-based material or an acrylic-based material.

In view of the above, the first organic layers 30 are connected to the second organic layers 50, and the second organic layers 50 are connected to the third organic layer 60. As a whole, the first organic layers 30, the second organic layers 50, and the third organic layer 60 may form a structure similar to a "rivet" embedded in the first inorganic layer 20 and the second inorganic layer 40. Due to the effective adhesion between the organic film layers, the structure enhances the adhesion between the third organic layer 60 and the second inorganic layer 40, and the adhesion between the second organic layers 40 and the first inorganic layer 20.

Since part of the first organic layers 30 are connected to the second inorganic layer 40, another part of the first organic layers 30 are connected to the second organic layers 50, and the adhesion between the organic film layers is large, it is difficult for the third organic layer 60 to peel from the second inorganic layer 40 when the display panel 100 is bent. That is, the probability that the third organic layer 60 peels from the second inorganic layer 40 is reduced.

In some embodiments, in order to reduce the manufacturing process of the display panel 100 and save human resources, the second organic layers 50 and the third organic layer 60 may be integrally formed. That is, the second organic layers 50 may be formed by filling the second receiving structures 41 with organic material while the third organic layer 60 is formed.

Finally, a fourth inorganic layer 70 may be deposited on the third organic layer 60 to complete the encapsulation of the display panel 100. It should be noted that the fourth inorganic layer 70 is a film layer made of inorganic material such as silicon oxide, silicon nitride, silicon oxynitride, aluminum oxide, or aluminum nitride. The fourth inorganic layer 70 can further protect the light-emitting structure 13 and other film layers to prevent the light-emitting structure 13 and other film layers from being affected by external water vapor or oxygen.

Figure 2:
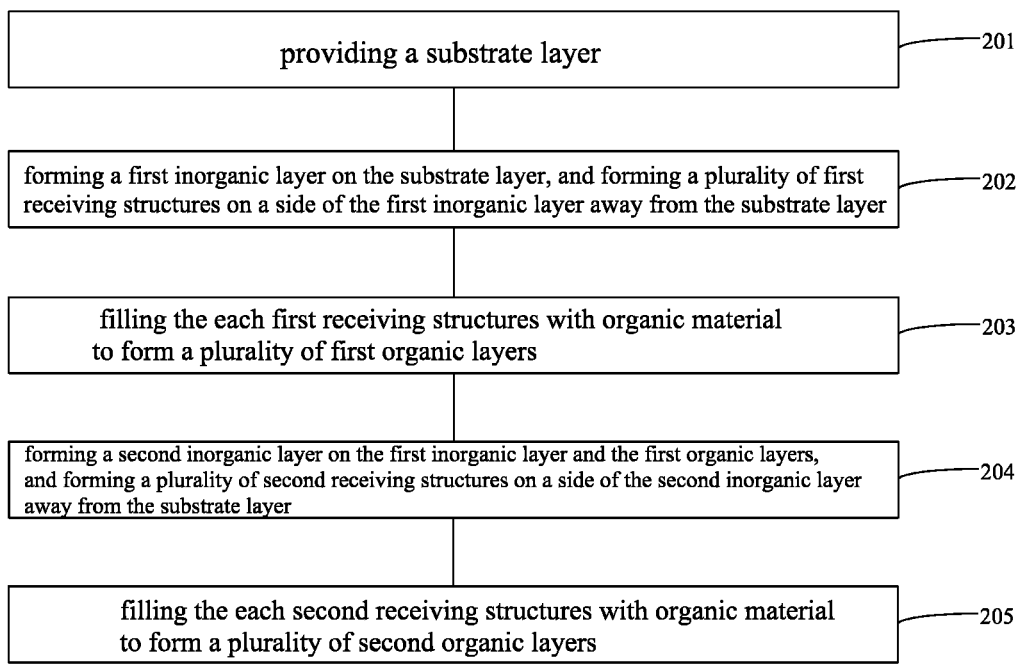
FIG. 2 is a schematic flowchart of a method of manufacturing a display panel according to an embodiment of the present application.

Please refer to FIG. 2, an embodiment of the present application further provides a method of manufacturing a display panel. The specific process of the method of manufacturing the display panel 100 may be as follows:

Step 201: providing a substrate layer 10.

The substrate layer 10 may include a substrate 11 and a flexible substrate 12, a light-emitting layer 23, and a third inorganic layer 14 which are sequentially stacked on the substrate 11. The flexible substrate 12 may be made of flexible material, such as polyimide. The flexible substrate 12 can increase the bending resistance of the display panel 100. The light-emitting layer 13 may be an organic light-emitting display array.

Step 202: forming a first inorganic layer 20 on the substrate layer 10, and forming a plurality of first receiving structures 21 on a side of the first inorganic layer 20 away from the substrate layer 10.

Specifically, the first inorganic layer 20 may be formed on the substrate layer 10 by the chemical vapor deposition method, and the plurality of first receiving structures 21 may be formed on the side of the first inorganic layer 20 away from the substrate layer 10 by etching.

Step 203: filling the each first receiving structures 21 with organic material to form a plurality of first organic layers 30.

Specifically, the each first receiving structures 21 may be filled with organic material by the inkjet printing technology to form the plurality of first organic layers 30.

Step 204: forming a second inorganic layer 40 on the first inorganic layer 20 and the first organic layers 30, and forming a plurality of second receiving structures 41 on a side of the second inorganic layer 40 away from the substrate layer 10.

Specifically, the second inorganic layer 40 is deposited on the first inorganic layer 20 and the first organic layers 30 by the chemical vapor deposition method, and the plurality of second receiving structures 41 are formed on the side of the second inorganic layer 40 away from the substrate layer 10 by etching.

Step 205: filling the each second receiving structures 41 with organic material to form a plurality of second organic layers 50.

Specifically, the each second receiving structures 41 by the inkjet printing technology may be filled with organic material to form the plurality of second organic layer 50.

In some embodiments, a third organic layer 60 may also be formed on the second organic layers 50 and the second inorganic layer 40 to cover the second organic layers 50 and the second inorganic layer 40. The first organic layers 30, the second organic layers 40, and the third organic layer 60 may form a "rivet" structure embedded in the first inorganic layer 20 and the second inorganic layer 40.

In the embodiment of the present application, the first organic layers 30, the second organic layers 40, and the third organic layer 60 may form a structure similar to a "rivet" embedded in the first inorganic layer 20 and the second inorganic layer 40. Since part of the first organic layers 30 are connected to the second inorganic layer 40, another part of the first organic layers 30 are connected to the second organic layers 50, and the adhesion between the organic film layers is large, it is difficult for the third organic layer 60 to peel from the second inorganic layer 40 when the display panel 100 is bent. That is, the probability that the third organic layer 60 peels from the second inorganic layer 40 is reduced. Moreover, due to the embedding of the organic film layers, the stress inside the first inorganic layer 20 and the second inorganic layer 40 is reduced, the bending resistance of the first inorganic layer 20 and the second inorganic layer 40 can be enhanced, and the bending resistance of the display panel 100 is further enhanced.

In the foregoing embodiments, descriptions of the embodiments have different emphases, and for parts that are not described in detail in one embodiment, refer to the related descriptions in the other embodiments.

The display panel and the method of manufacturing the same provided in the embodiments of the present application have been described in detail above. Specific examples are used herein to explain the principles and implementation of the present application. The description of the above embodiments is merely used to help understand the technical solution and the core ideas of the present application. It should be understood by persons of ordinary skill in the art that modifications may still be made to the technical solutions described in the embodiments, or equivalent replacements may be made to some technical features in the technical solutions, as long as such modifications or replacements do not cause the essence of corresponding technical solutions to depart from the spirit and scope of the technical solutions in the embodiments of the present application.

What is claimed is:

1. A display panel, comprising:
   a substrate layer;
   a first inorganic layer disposed on the substrate layer, and a plurality of first receiving structures being disposed on a side of the first inorganic layer away from the substrate layer;
   a plurality of first organic layers respectively disposed in the first receiving structures;
   a second inorganic layer disposed on the first inorganic layer and the first organic layers, and a plurality of second receiving structures disposed on a side of the second inorganic layer away from the substrate layer; and
   a plurality of second organic layers respectively disposed in the second receiving structures.

2. The display panel of claim 1, wherein the first receiving structures are grooves or via holes, and the second receiving structures are grooves or via holes.

3. The display panel of claim 1, wherein the first receiving structures are via holes, the second receiving structures are via holes, and the second receiving structures expose the first inorganic layer and the first organic layers.

4. The display panel of claim 1, wherein the display panel further comprises a third organic layer, and the third organic layer covers the second organic layers and the second inorganic layer.

5. The display panel of claim 4, wherein the third organic layer is integrally formed with the second organic layers.

6. The display panel of claim 4, wherein the display panel further comprises a fourth inorganic layer, and the fourth inorganic layer is disposed on the third organic layer.

7. The display panel of claim 1, wherein the substrate layer comprises a substrate and a flexible substrate, a light-emitting layer, and a third inorganic layer which are sequentially stacked on the substrate.

8. The display panel of claim 1, wherein number of the first receiving structures is the same as number of the second receiving structures.

9. The display panel of claim 1, wherein material of the first inorganic layer comprises silicon oxide, silicon nitride, silicon oxynitride, aluminum oxide, or aluminum nitride.

10. The display panel of claim 1, wherein material of the first organic layers comprises epoxy-based organic material or acrylic-based organic material.

11. A method of manufacturing a display panel, comprising:
    providing a substrate layer;
    forming a first inorganic layer on the substrate layer, and forming a plurality of first receiving structures on a side of the first inorganic layer away from the substrate layer;
    filling the each first receiving structures with organic material to form a plurality of first organic layers;
    forming a second inorganic layer on the first inorganic layer and the first organic layers, and forming a plurality of second receiving structures on a side of the second inorganic layer away from the substrate layer; and
    filling the each second receiving structures with organic material to form a plurality of second organic layers.

12. The method of manufacturing the display panel of claim 11, wherein the first receiving structures are grooves or via holes, and the second receiving structures are grooves or via holes.

13. The method of manufacturing the display panel of claim 11, wherein the first receiving structures are via holes, the second receiving structures are via holes, and the second receiving structures expose the inorganic layer and the first organic layers.

14. The method of manufacturing the display panel of claim 11, wherein the method further comprises forming a third organic layer on the second inorganic layer to cover the second organic layers and the second inorganic layer.

15. The method of manufacturing the display panel of claim 14, wherein the method further comprises forming a fourth inorganic layer on the third organic layer.

16. The method of manufacturing the display panel of claim 11, wherein the substrate layer comprises a substrate and a flexible substrate, a light-emitting layer, and a third inorganic layer which are sequentially stacked on the substrate.

17. The method of manufacturing the display panel of claim 16, wherein the light-emitting layer is an organic light-emitting array.

18. The method of manufacturing the display panel of claim 11, wherein number of the first receiving structures is the same as number of the second receiving structures.

19. The method of manufacturing the display panel of claim 11, wherein material of the first inorganic layer comprises silicon oxide, silicon nitride, silicon oxynitride, aluminum oxide, or aluminum nitride.

20. The method of manufacturing the display panel of claim 11, wherein material of the first organic layers comprises epoxy-based organic material or acrylic-based organic material.

* * * * *